Dec. 12, 1972 R. H. DEAN 3,706,014

SEMICONDUCTOR DEVICE

Filed Sept. 11, 1970 2 Sheets-Sheet 1

INVENTOR.
RAYMOND H. DEAN
BY Donald S. Cohen
Attorney

Dec. 12, 1972 R. H. DEAN 3,706,014

SEMICONDUCTOR DEVICE

Filed Sept. 11, 1970 2 Sheets-Sheet 2

INVENTOR.
RAYMOND H. DEAN
BY
Donald S. Cohen
Attorney

1

3,706,014
SEMICONDUCTOR DEVICE
Raymond Harkless Dean, Lawrenceville, N.J., assignor to RCA Corporation
Filed Sept. 11, 1970, Ser. No. 71,456
Int. Cl. H01l 17/00
U.S. Cl. 317—234 R 8 Claims

ABSTRACT OF THE DISCLOSURE

Spaced cathode and anode contacts engage a semiconductor layer with at least the cathode contact forming an injecting junction with the semiconductor layer. A third contact between the cathode and anode contacts and adjacent the cathode contact forms a blocking junction with the semiconductor layer and is electrically connected to the cathode contact. A voltage applied between the cathode and anode contacts creates an electrical field along the surface of the semiconductor layer with the profile of the electrical field being adjusted by the voltage applied to the third contact. The profile of the electrical field can be varied by changing the distance between the anode facing end of the third contact and the anode facing end of the cathode contact and/or by changing the voltage applied to the third contact with respect to the voltage applied to the cathode contact.

BACKGROUND OF THE INVENTION

The invention herein described was made in the course of or under a contract or subcontract thereunder with the Department of the Air Force.

The present invention relates to a semiconductor device having means for adjusting the electric field created along a layer of semiconductor material between two contacts when a voltage is applied between the contacts and particularly to transferred electron effect amplifiers utilizing such means.

One type of semiconductor device includes a layer of a semiconductor material, such as silicon, germanium or a mixed compound semiconductor material, having a pair of spaced contacts engaging the semiconductor layer so as to form injecting junctions with the semiconductor layer. When a voltage is applied between the contacts a D.C. electrical field is created along the surface of the semiconductor layer between the contacts. It has been found that for a variety of reasons this field tends to be non-uniform along the length of the semiconductor layer and is generally very high near the anode contact. This non-uniformity is accentuated in semiconductor devices using a semiconductor material which exhibits a differential negative resistance, such as gallium arsenide and similar mixed compound semiconductor materials, when the semiconductor material is in a field whose magnitude exceeds the transferred electron threshold. For the proper operation of those semiconductor devices, particularly those using a semiconductor material which exhibits a differential negative resistance, it is often desirable to have the electrical field substantially uniform along the entire length of the semiconductor layer.

Although various techniques have been attempted to overcome this problem of the non-uniform field, such

2 attempts have not been found to be entirely satisfactory. One technique which was attempted is described in the article "The shielded-cathode mode Gunn device: a proposed new mode of Gunn device operation" by R. Holmstrom and S. D. Milleman, "The Shielded-Cathode Mode Gunn Device: a Proposed New Mode of Gunn Device Operation," Solid State Electronics, 13, pages 513–515 (1970). This technique includes coating the semiconductor material layer between the contacts with a layer of an insulating material and extending the cathode contact over the insulating layer to the region on the semiconductor layer where the field is high. The purpose of this technique is to electrically isolate the portion of the length of the semiconductor layer where the electrical field is low by extending the cathode contact over that portion and utilize only the portion of the length of the semiconductor layer where the electrical field is high. However, as stated in this article, this technique did not provide a satisfactorily operating device. Even if this technique would provide a satisfactorily operating device, it has the disadvantage that it would require a relatively large device to achieve an electrically active portion of the semiconductor layer of any suitable length since the major portion of the length of the semiconductor material layer between the contacts must be isolated and therefore wasted.

Another technique which has been attempted to provide a uniform electrical field is to modify the contacts forming the injecting junctions with the semiconductor material layer. A major factor causing the non-uniform electrical field is that contacts which form good injecting junctions with the semiconductor material generally have a higher free-carrier density than the semiconductor material. If the contact could be modified to have a free-carrier density equal to that of the semiconductor material, a more uniform electrical field should be provided. However, as yet, no satisfactory technique has been developed which will uniformly produce such a contact.

SUMMARY OF THE INVENTION

A semiconductor device includes a layer of a semiconductor material having a pair of spaced contacts at least one of which forms an injecting junction with the semiconductor layer. Means forming a blocking junction with said semiconductor layer is provided between said contacts and adjacent the contact forming an injecting junction. The means is adapted to change the profile of the electrical field formed along the semiconductor layer when a voltage is applied between the contacts.

DETAILED DESCRIPTION

Figure 1:
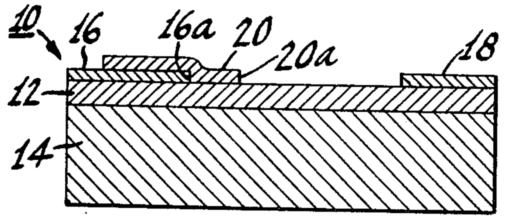
FIG. 1 is a sectional view of one form of the semiconductor device of the present invention.
Figure 2:
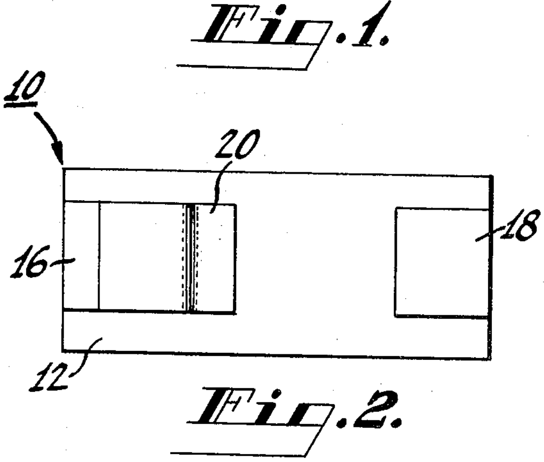
FIG. 2 is a top plan view of the semiconductor device of FIG. 1.

Referring initially to FIGS. 1 and 2, one form of the semiconductor device of the present invention is generally designated as 10. The semiconductor device 10 comprises a layer 12 of a semiconductor material, such as silicon, germanium, or a mixed compound semiconductor material, coated on the surface of a substrate 14. The substrate 14 is of an electrical insulating or semi-insulating material on which the semiconductor material layer 12 can be grown, such as sapphire, spinel or a high resistivity semiconductor material. A pair of spaced contacts 16 and 18 are provided on the semiconductor layer 12. The contact 16 is of a material which will form an injecting junction with the semiconductor layer 12. For example, the contact 16 may be a film of an electrically conductive metal, metal alloy or mixture of metals which will have an ohmic contact with the particular semiconductor material of the layer 12 or may be a layer of a low resistance semiconductor material. The contact 18 may also form an injecting junction with the semiconductor layer 12 or may form a blocking junction with the semiconductor layer. Although the contacts 16 and 18 are shown as being coated on the surface of the semiconductor layer 12, they may be either on the surface of the substrate 14, in pockets in the surface of the substrate 14 with the semiconductor layer 12 extending over or engaging the contacts or diffused regions in the semiconductor layer 12. The contacts 16 and 18 are adapted to be connected to a voltage source with the contact 16 being the cathode and the contact 18 being the anode.

A third contact 20 is on the surface of the semiconductor layer 12 between the contacts 16 and 18 and adjacent the cathode contact 16. The third contact 20 is of a material which forms as blocking junction with the semiconductor material of the layer 12. For example, the third contact 20 can be of a metal which will form a Schottky surface barrier junction with the semiconductor layer 12 or can be of a semiconductor material of a conductivity type opposite to that of the semiconductor layer 12 so as to provide a P-N junction between the third contact and the semiconductor layer 12. As shown in FIGS. 1 and 2, the third contact 20 extends over and engages the cathode contact 16 so as to be electrically connected thereto. Thus, where a voltage is applied between the cathode contact 16 and the anode contact 18, the same voltage is applied between the third contact 20 and the anode contact 18.

In a semiconductor device similar to the semiconductor device 10 shown in FIGS. 1 and 2 but without the third contact 20, when a voltage is applied between the cathode and anode contacts, a non-uniform electrical field forms along the surface of the semiconductor layer between the contacts which is generally very high near the anode contact. However, when the same voltage is applied between the cathode and the anode 16 and 18 of the semiconductor device 10, which voltage is also applied between the third contact 20 and the anode contact 18, the profile of the electrical field formed along the semiconductor layer 12 is changed so that it is lowered adjacent the anode and increased adjacent the cathode. It is believed that this effect results from the fact that the voltage across the blocking junction between the third contact 20 and the semiconductor layer 12 depletes the portion of the semiconductor layer beneath the third contact of carriers so as to provide a pinch-off effect. This pinch-off effect acts to offset the increased tendency for carriers to flow out of the cathode contact 16. Thus, the blocking junction between the third contact and the semiconductor layer 12 provides the same effect as reducing the carrier concentration of the cathode contact 16 so as to change the profile of the electrical field formed along the semiconductor layer 12.

It has been found that the extent of the change of the profile of the electrical field can be varied by changing the distance between the anode-facing end 16*a* of the cathode contact 16 and the anode-facing end 20*a* of the third contact 20. As the distance between the end 16*a* of the cathode contact 16 and the end 20*a* of the third contact 20 is increased, the electrical field decreases adjacent the anode contact 18 and increases adjacent the cathode contact 16. Thus, by increasing this distance the electrical field can be changed so that it is substantially uniform along the semiconductor layer 12 between the contacts 18 and 20 or even so that it is higher adjacent the cathode contact 16 than adjacent the anode contact 18.

Figures 3, 5:
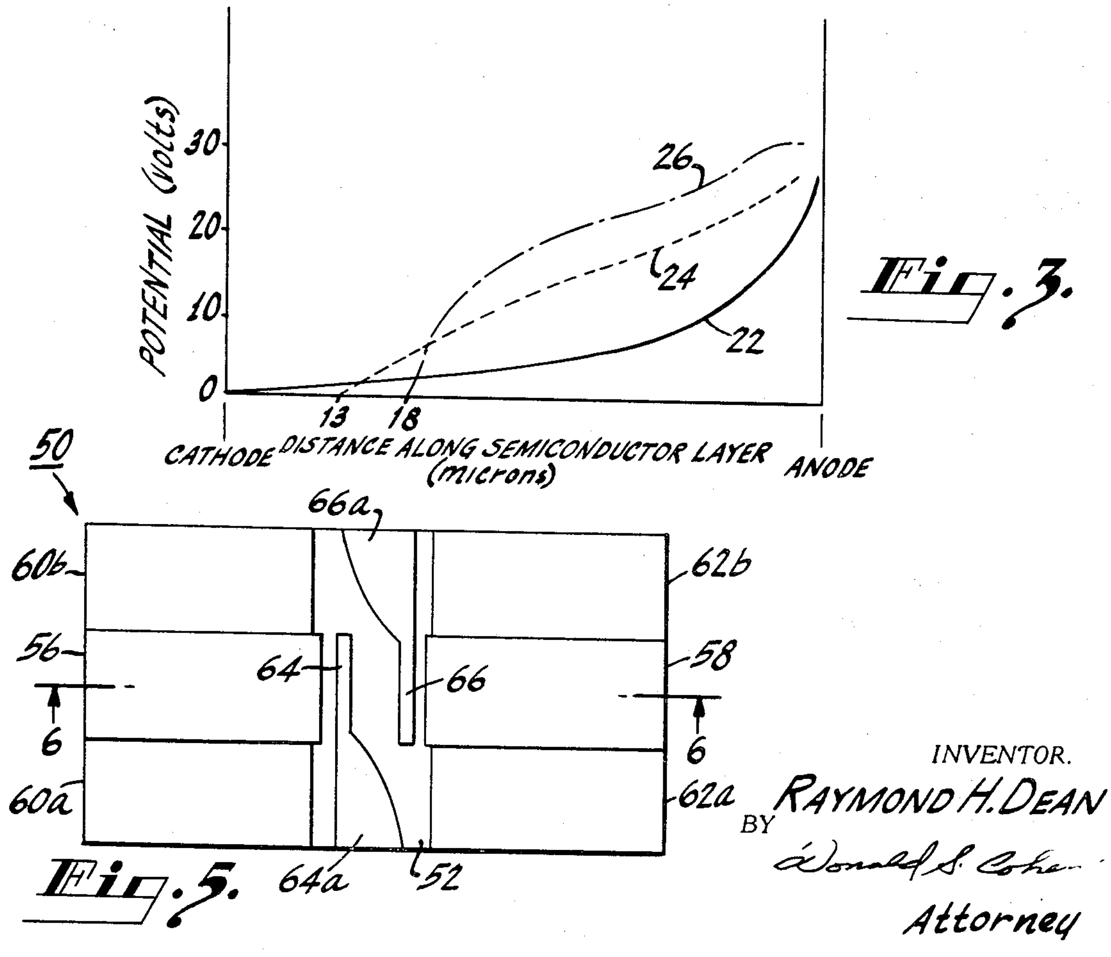
FIG. 3 is a graph showing the changes in the profile of the electrical field that can be achieved with the semiconductor device of the present invention.
FIG. 5 is a top plan view of a semiconductor device of the present invention in the form of a traveling wave amplifier.

This effect can be seen in FIG. 3 which is a graph of the electrical potential along the length of the semiconductor layer 12 between the cathode contact 16 and the anode contact 18. The semiconductor device 10 used to obtain this graph includes a semiconductor layer 12 of N-type gallium arsenide having a doping concentration of approximately $1 \times 10^{15}$ cm.$^{-3}$ and approximately 1 micron thick on a semi-insulating substrate 14 of gallium arsenide. The cathode contact 16 and anode contact 18 are films of gold-germanium alloy coated on the surface of the semiconductor layer 12 and forming injecting junctions with the semiconductor layer. The contacts 16 and 18 are 0.5 millimeter in width and are spaced apart a distance of 66 microns. The third contact 20 is a film of aluminum forming a Schottky surface barrier junction with the semiconductor layer 12. A voltage of 30 volts is applied between the cathode and anode contacts 16 and 18.

The line 22 indicates the potential along the semiconductor layer 12 with no third contact 20. The line 24 indicates the potential along the semiconductor layer 12 with the third contact 20 having its end 20*a* spaced from the end 16*a* of the cathode contact 16 a distance of 13 microns. The line 26 indicates the potential along the semiconductor layer 12 with the third contact 20 having its end 20*a* spaced from the end 16*a* of the cathode contact 16 a distance of 18 microns. The slope of the lines 22, 24 and 26 at any point therealong is the magnitude of the electrical field at that point. Thus, the steeper the slope the higher the electrical field and vice versa. Line 22 has a shallow slope adjacent the cathode but a very steep slope adjacent the anode. Thus, without the third contact 20, the electrical field is non-uniform along the length of the semiconductor layer and is low adjacent the cathode but very high adjacent the anode. Line 24 has a substantially uniform slope showing a substantially uniform electrical field along the length of the semiconductor layer. Thus, by providing the third contact 20, which in this case has its end 20*a* spaced from the end 16*a* of the cathode 16 a distance of 13 microns, a substantially uniform field is achieved along the entire length of the semiconductor layer. Line 26 has a relatively steep slope adjacent the cathode but a more shallow slope adjacent the anode. Thus, by extending the end 20*a* of the third contact 20 to a distance of 18 microns from the end 16*a* of the cathode 16 the electrical field is again non-uniform but is higher adjacent the cathode than adjacent the anode. Thus, by varying the distance between the end 20*a* of the third contact 20 and the end 16*a* of the cathode contact 16, the profile of the electrical field along the semiconductor layer 12 can be changed to achieve any desired profile including a substantially uniform electrical field. The particular distance between the end 20*a* of the third contact 20 and the end 16*a* of the cathode contact 16 which will provide a desired profile of the electrical field will vary depending on the thickness and doping density of the semiconductor layer 12, the distance between the cathode and anode contacts 16 and 18 and the voltage applied.

Figure 4:
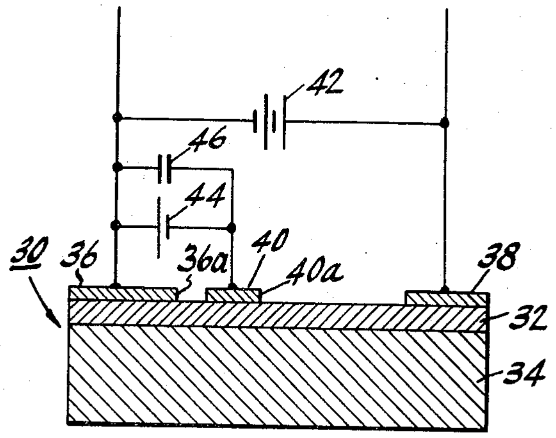
FIG. 4 is a sectional view of another form of the semiconductor device of the present invention.

Although the third contact 20 of the semiconductor device 10 is shown as extending up to the end 16a of the cathode contact 16 and being directly electrically connected to the cathode contact 16, the third contact 20 can be spaced from the cathode contact 16 and electrically connected thereto externally of the semiconductor device 10. Referring to FIG. 4 there is shown such a semiconductor device, which is designated as 30. The semiconductor device 30, like the semiconductor device 10 of FIGS. 1 and 2, comprises a layer 32 of a semiconductor material coated on the surface of a substrate 34 of an electrical insulating or semi-insulating material, and cathode and anode contacts 36 and 38, respectively, in spaced relation on the semiconductor layer 32. At least the cathode contact 36 is of a material forming an injecting junction with the semiconductor layer 32. A third contact 40 is on the semiconductor layer 32 between the cathode and anode contacts 36 and 38 and adjacent the cathode contact 36. However, the third contact 40 is spaced from the end 36a of the cathode contact 36. The third contact 40, like the third contact 20 of the semiconductor device 10 of FIGS. 1 and 2, is of a material forming a blocking junction with the semiconductor 32, such as either a Schottky surface barrier junction or a PN junction.

In the operation of the semiconductor device 30, the cathode contact 36 and anode contact 38 are connected across a D.C. voltage source, such as a battery 42. The third contact 40 can be electrically connected directly to the cathode contact 36 so that the same voltage applied to the cathode contact 36 is also applied to the third contact 40. However, as shown, the third contact 40 is electrically connected to the cathode contact 36 through a second D.C. voltage source, such as a battery 44 in parallel with a capacitor 46, so that the voltage applied to the third contact 40 can be adjusted with respect to the voltage applied to the cathode contact 36 by adjusting or selecting the voltage of the battery 44.

As in the semiconductor device 10 of FIGS. 1 and 2, the voltage applied between the cathode and anode contacts 36 and 38 of the semiconductor device 30 creates an electrical field along the surface of the semiconductor layer 32 and the voltage applied to the third contact 40 modifies the profile of this electrical field in a manner depending on the distance between the end 40a of the third contact 40 and the end 36a of the cathode contact 36. It has been found that by varying the voltage applied between the third contact 40 and the cathode contact 36, the profile of the electrical field created along the semiconductor layer 32 is varied in a manner similar to that achieved by varying the distance between the end 40a of the third contact 40 and the end of the cathode contact 36a. As the voltage applied to the third contact 40 is made more negative with respect to the voltage applied to the cathode contact 36 the effect on the profile of the electrical field is the same as that obtained by lengthening the distance between the end 40a of the third contact 40 and the end 36a of the cathode contact 36. Thus, the profile of the electrical field created along the semiconductor layer 32 can be changed either by varying the distance between the end 40a of the third contact 40 and the end 36a of the cathode contact 36 and/or by varying the voltage applied to the third contact 40 with respect to the voltage applied to the cathode contact 36.

The semiconductor device 10 of FIGS. 1 and 2 and the semiconductor device 30 of FIG. 4 can be used as a two-terminal microwave reflection amplifier by making the semiconductor layer of a semiconductor material which exhibits a differential negative resistance through transferred electron effects, such as N-type gallium arsenide and other III–V compounds or mixtures of such compounds. The cathode and anode contacts are connected across a D.C. voltage source which will create an electrical field along the surface of the semiconductor layer which is above the negative resistance threshold voltage of the semiconductor material of the layer. Preferably, the profile of the electrical field is adjusted to be substantially uniform along the length of the semiconductor layer by properly adjusting the distance between the end of the third contact and the end of the cathode contact and/or the voltage applied to the third contact as previously described. The cathode contact and the anode contact are also connected across the source of an R.F. signal input for the amplifier which source will also receive the output signal from the amplifier. When an RF input signal of a frequency at the transit time frequency or harmonics of the transit time frequency of the semiconductor layer is applied to the semiconductor device, the negative resistance of the semiconductor layer strengthens the R.F. signal as it passes through the semiconductor layer from the cathode contact to the anode contact so that the output signal from the semiconductor device is amplified over the input signal.

The semiconductor device of the present invention, which has a thin layer of the semiconductor material when used as a microwave reflector amplifier, has a number of advantages over microwave reflection amplifiers previously used, which comprise a body of the semiconductor material having contacts at opposite ends thereof with the signal passing through the bulk of the body between the contacts. In the bulk-type reflection amplifiers previously used, the negative resistance of the semiconductor material body is strongest at the transit time frequency of the body and becomes decreasingly weaker at the higher harmonics of the transit time frequency. Thus, in practice, these devices have to be operated near the transit time frequency. To have a bulk-type reflection amplifier for operation at higher frequencies, it has been necessary to decrease the transit time by decreasing the distance from cathode to anode. This also reduces the voltage and therefore the impedance level and power level of the device. To obtain the same power at a higher frequency, one must make the device more highly doped or wider to increase the current, and this further reduces the impedance level. A practical lower limit on the impedance level which can be used with actual circuits puts an upper limit on the power$\times$frequency$^2$ factor for a transit-time device. However, it has been found that the semiconductor device of the present invention has as strong a negative resistance at the higher harmonics of the transit time frequency as it does at the transit time frequency. Thus, for higher frequency this device can be operated at a higher harmonic of the transit time frequency instead of having the distance from cathode to anode reduced. Thus, the impedance of the semiconductor device of the present invention does not have to decrease as the frequency is increased. This permits operation of the semiconductor device at high power levels and high frequencies and also high impedance levels, and thus it enables one to escape the usual power$\times$frequency$^2$ factor limitation.

Another problem which exists in the bulk-type reflection amplifiers results from the heat generated in the semiconductor material when the device is operated at high power levels. In order to maintain proper operation of the device, sufficient amount of the heat must be removed so that the device does not operate above a limiting temperature. The heat is generally removed by heat sinks mounted against the contacts at the end of the semiconductor body. However, this requires that the heat pass through the length of the body to the heat sinks and does not provide acceptable removal of the heat, particularly if the device is operated under continuous wave input. However, in the semiconductor device of the present invention, the semiconductor layer extends over the surface of an electrically-insulating substrate which can also be a good conductor of heat and which has a much greater mass than that of the semiconductor layer. The heat generated in the semiconductor layer passes directly and quickly into the substrate so that the semiconductor layer is maintained relatively cool. Therefore, the semiconductor device of the present invention is capable of being operated under a continuous wave input signal since the heat generated in the semiconductor layer would be quickly removed therefrom into the substrate. Also, the semiconductor device can be used as part of an integrated circuit.

Although the semiconductor device of the present invention has been described as being capable of being used as a microwave reflection amplifier at high frequencies, it can also be used as a reflection amplifier at lower frequencies by adjusting the electrical field along the semiconductor layer so that the electrical field is higher adjacent the cathode contact than adjacent the anode contact. As previously described, this can be accomplished by increasing the distance between the anode facing end of the third contact and the anode facing end of the cathode contact and/or by making the voltage applied to the third contact more negative as compared to the voltage applied to the cathode contact. Also, the semiconductor device can be used as an oscillator for generated microwave power by including a feedback circuit in the circuit which receives the output signal from the semiconductor device so that the R.F. input signal to the semiconductor is built up until the semiconductor device oscillates.

Figure 6:
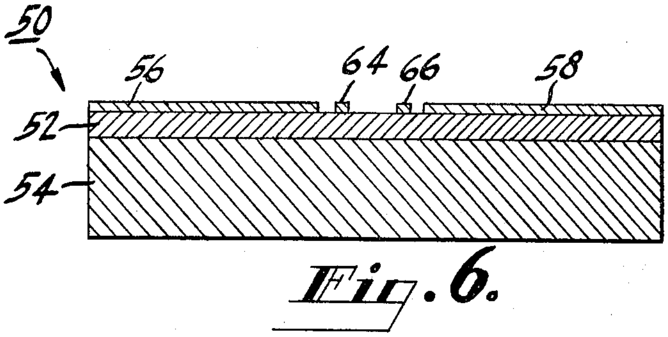
FIG. 6 is a sectional view taken along line 6—6 of FIG. 5.

Referring to FIGS. 5 and 6, there is shown another form of the semiconductor device, generally designated as 50, which can be used as a traveling wave amplifier. The amplifier 50 comprises a layer 52 of a semiconductor material which exhibits a differential negative resistance through transferred electron effect, such as N-type gallium arsenide or other III–V semiconductor compounds or mixtures of such compounds, on the surface of a substrate 54 of an electrical insulating or semi-insulating material. A pair of contacts 56 and 58 are in spaced relation on the semiconductor layer 52. The contacts 56 and 58 are of a material which forms an injecting junction with the semiconductor layer 52, such as a film of a metal in ohmic contact with the semiconductor layer 52 or a layer of a low resistivity semiconductor material of the same kind as that of the semiconductor layer 52. As shown, the contacts 56 and 58 extend to opposite ends of the substrate 54. Contact termination films 60*a* and 60*b* of an electrically conductive material extend from opposite sides of the contact 56 to the sides of the substrate 54, and contact termination films 62*a* and 62*b* of an electrically-conductive material extend from opposite sides of the contact 58 to the sides of the substrate 54. The termination films 60*a*, 60*b*, 62*a* and 62*b* are electrically insulated from the semiconductor layer 52 either by a layer of an electrically-insulating material between the termination films and the semiconductor layer or by making the termination films of a material which forms a blocking junction with the semiconductor layer, such as a metal which provides a Schottky surface barrier junction with the semiconductor layer. A narrow input contact 64 is on the surface of the semiconductor layer 52 and extends along but is spaced from the end of the contact 56. A narrow output contact 66 is on the surface of the semiconductor layer 52 and extends along but is spaced from the end of the contact 58. The input contact 64 has a wider termination portion 64*a* extending to one side of the substrate 54, to substantially center portion 64*a* between the contact termination films 60*a* and 62*a*. The output contact 66 has a wider termination portion 66*a* extending to the other side of the substrate to substantially center portion 66*a* between the contact termination films 60*b* and 62*b*. The input and output contacts 64 and 66 are center conductors in coplanar waveguides, whose microwave ground planes are the larger conducting surfaces 60 and 62 and their terminating films. The conductors 64 and 66 change from eccentric positions in the center of the substrate to substantially concentric positions at the sides of the substrate. The widths and lengths of the input and output electrodes 64 and 66 and the distances between these electrodes and the microwave ground planes 60 and 62 and their terminating films are established to maintain the proper impedances for good coupling with the microwave input and output lines. The input and output contacts 64 and 66 are each of a material which forms a blocking junction with the semiconductor layer 52, such as a metal which forms a Schottky surface barrier junction or a P-type semiconductor material of the same kind as that of the semiconductor layers so as to provide a PN junction.

In the use of the amplifier 50, the contact 58 is connected to ground and the contact 56 is connected to ground through a D.C. voltage source which applies a bias to the contact 56 so that the contact 56 is a cathode and the contact 58 is an anode. The input contact 64 is connected to a source of an R.F. signal and the output contact is connected to means for receiving the amplified R.F. signal. The input contact 64 is also electrically connected to the cathode contact 56 through a low-pass filter, with the possibility of a series D.C. voltage source to bias the input contact with respect to the cathode contact 56. In microwave circuits, the amplifier 50 would generally be connected to the means providing the input signal and the means receiving the output signal through distributed lines of the type having a conductor electrically within and insulated from a ground plane. For such connections, the ground plane of the input line would be connected to the terminations film 62*a* of the anode 58 and the ground plane of the output line would be connected to the termination film 62*b* of the anode 58. The D.C. voltage source for the cathode 56 would be connected between either of the termination films 60*a* and 60*b* and the ground plane of either the input line or output line. The conductor of the input line would be connected to the termination portion 64*a* of the input contact 64 and the conductor of the output line would be connected to the termination portion 66*a* of the output contact 66. The low-pass filter and D.C. voltage source for biasing the input contact 64 would be connected between either of the cathode termination films 60*a* and 60*b* and the input contact termination portion 64*a*.

In the operation of the amplifier 50, the D.C. bias applied to the cathode 56 creates an electrical field along the surface of the semiconductor layer 52 between the cathode 56 and the anode 58. The bias applied should be of sufficient magnitude so that the electrical field is above the negative resistance threshold voltage of the semiconductor material of the layer 52. The profile of the electrical field is made substantially uniform along the length of the semiconductor layer by adjusting the position of the input contact 64 and/or by adjusting the D.C. bias applied to the input contact 64 as previously described. The R.F. signal applied to the input contact 64 creates a corresponding R.F. signal in the semiconductor layer 52 which travels from the cathode end to the anode end of the device. As the R.F. signal passes through the semiconductor layer 52, the negative resistance of the semiconductor layer strengthens the signal so that the output signal from the output contact 66 is amplified over the input signal.

The traveling wave amplifier 50 has an advantage over the reflection amplifier previously described in that the output signal is fed out over a line separate from the line providing the input signal whereas in the reflection amplifier the output signal is fed out over the same line that provides the input signal. Thus, the circuitry used with the reflection amplifier must include means, such as a circulator, to separate the output signal from the input signal, whereas with the traveling wave amplifier 50, the output signal can be fed directly to the circuit which is to receive the amplified signal without any additional intermediate circuitry. The traveling wave amplifier 50 has the same good heat conducting characteristics as previously described for the reflection amplifier so that it should be capable of continuous wave operation. Also, it has been found that the phase of the output signal can be shifted with regard to the phase of the input signal by increasing the voltage applied to the cathode contact. In addition, as can be seen in FIG. 5, the construction of the traveling wave amplifier 50 is symmetrical. Thus, although the contact 64 has been described as the input contact and the contact 66 as the output contact, they can be reversed so that the contact 66 is the input contact and the contact 64 is the output contact. When the contacts 64 and 66 are so reversed, the contacts 56 and 58 must also be reversed so that the contact 58 is the cathode and the contact 56 is the anode. The traveling wave amplifier 50 can also be made a part of an integrated circuit.

Figure 7:
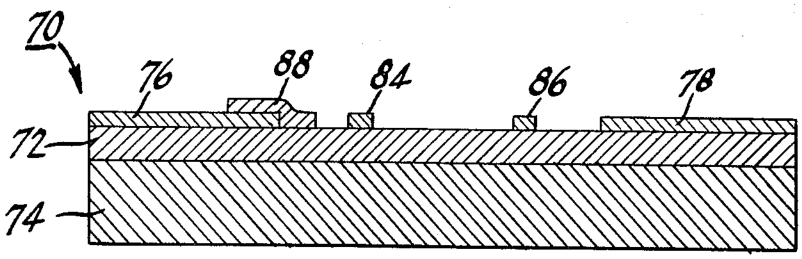
FIG. 7 is a sectional view similar to FIG. 6 of a modification of the traveling wave amplifier.

Referring to FIG. 7, there is shown another form of the semiconductor device of the present invention, generally designated as 70, which is a modification of the traveling wave amplifier shown in FIGS. 5 and 6. The traveling wave amplifier 70 is of the same construction as the traveling wave amplifier 50 of FIGS. 5 and 6 in that it includes a layer 72 of a semiconductor material which exhibits a differential negative resistance through transferred electron effect on the surface of a substrate 74 of an electrical insulating or semi-insulating material. Spaced cathode and anode contacts 76 and 78 are on the surface of the semiconductor layer 72 and input and output contacts 84 and 86 are on the surface of the semiconductor layer 72 between and adjacent to the cathode and anode contacts 76 and 78, respectively. The cathode and anode contacts 76 and 78, like the cathode and anode contacts 56 and 58 of the traveling wave amplifier 50, are of a material which forms an injecting junction with the semiconductor layer 72. The input and output contacts 84 and 86, like the input and output contacts 64 and 66 of the traveling wave amplifier 50, are of a material which forms a blocking junction with the semiconductor layer 72. However, the traveling wave amplifier 70 includes an additional contact 88 on the surface of the semiconductor layer 72 between the cathode contact 76 and the input contact 84 but adjacent the cathode contact 76. The additional contact 88 extends to the end of the cathode contact 76 and over the cathode contacts so as to be electrically connected thereto. The additional contact 88 is of a material forming a blocking junction with the semiconductor layer 72, such as a metal forming a Schottky surface barrier junction with the semiconductor layer 72 or a P-type conductivity semiconductor material of the same kind as that of the semiconductor layer 72 and forming a PN junction with the semiconductor layer.

The traveling wave amplifier 70 is used and operates in the same manner as previously described with regard to the amplifier 50 of FIGS. 5 and 6. The D.C. voltage applied to the input contact 84 adjusts the profile of the electrical field created along the surface of the semiconductor layer 72 so that the electrical field is substantially uniform between the input and output contacts 84 and 86. However, the additional contact 88 extends from the cathode contact 76 a distance such that the voltage applied to the additional contact 88 also makes the electrical field substantially uniform between the cathode contact 76 and the input contact 84. This modification of the electrical field improves the gain and noise figure of the amplifier 70 by improving the input coupling and also permits the amplifier to operate at the higher harmonics of the input coupler transit time frequency to obtain high power levels without any substantial decrease in the impedance of the amplifier's input circuit.

In addition, one can connect the output contact 86 to the anode 78 through a low pass filter and an adjustable DC voltage source in the same way that input contact 84 is connected to the cathode contact 76. A separate adjustment of the voltage on contact 86 relative to contact 78 controls the field profile between 86 and 78 independent of the profile between 84 and 86. This provides an additional smoothing of the overall field profile and more specifically enables one to optimize the field profile in the output circuit part of the device. This modification of the electric field further improves the gain and saturation power of the amplifier 70 by improving the output coupling and also permits the amplifier to operate at the higher harmonics of the output coupler transit time frequency to obtain high power levels without any substantial decrease in the impedance of the amplifier's output circuit. Thus, the additional modifications introduced in device 74 permit independent control of the field profile in three separate regions of the device: the input region between contacts 76 and 84, the traveling wave region between 84 and 86, and the output region between 86 and 78.

What is claimed is:

1. A semiconductor amplifier device comprising:
a substrate of a substantially insulating material,
a thin layer of a semiconductor material which exhibits a differential negative resistance through transferred electron effect on a surface of the substrate,
spaced cathode and anode contacts engaging said semiconductor layer with at least the cathode contact forming an injecting junction with said semiconductor layer,
a third contact on said semiconductor layer between said cathode and anode contacts and adjacent the cathode contact, said third contact forming a blocking junction with said semiconductor layer, and
means for biasing said contacts to provide a steady field which is above the negative resistance threshold of the semiconductor material of the layer substantially along the entire length of the layer between the third contact and the anode.

2. A semiconductor device in accordance with claim 1 in which the third contact is of a metal forming a Schottky surface barrier junction with the semiconductor layer.

3. A semiconductor device in accordance with claim 1 in which the third contact is of a semiconductor material forming a PN junction with the semiconductor layer.

4. A semiconductor device in accordance with claim 1 in which the third contact is electrically connected to the cathode contact.

5. A semiconductor device in accordance with claim 4 in which the voltage applied to the third contact and the position of the third contact with regard to the cathode contact is such that the electrical field is substantially uniform between the cathode contact and the anode contact.

6. A semiconductor amplifier device comprising:
a substrate of substantially insulating material,
a thin layer of a semiconductor material which exhibits a differential negative resistance through transferred electron effect on a surface of the substrate,
spaced cathode and anode contacts engaging said semiconductor layer and forming injecting junctions with said semiconductor layer,
spaced input and output contacts on said semiconductor layer, said input contact being between said cathode and anode contacts adjacent the cathode contact and forming a blocking junction with said semiconductor layer and said output contact being adjacent the anode contact, and
means for biasing said contacts to provide a steady field which is above the negative resistance threshold of the semiconductor material of the layer substantially along substantially the entire length of the layer between the input contact and the anode.

7. A semiconductor device in accordance with claim 6 in which the input contact is electrically connected to said cathode contact.

8. A semiconductor device in accordance with claim 7 in which the voltage applied to the input contact and the position of the input contact with regard to the cathode contact is such that the electrical field is substantially uniform between the input and output contacts.

References Cited

UNITED STATES PATENTS

| | | | |
|---|---|---|---|
| 3,566,306 | 2/1971 | Esposito et al. | 331—107 |
| 3,424,627 | 1/1969 | Michel et al. | 148—174 |
| 3,528,035 | 9/1970 | Uenohara | 332—16 |
| 3,543,104 | 11/1970 | Umeda | 317—234 |
| 3,587,000 | 6/1971 | Heeks | 331—107 |
| 3,535,601 | 10/1970 | Matsukura et al. | 317—235 |
| 3,588,736 | 6/1971 | McGroddy | 331—47 |

OTHER REFERENCES

IBM, TDB, "Frequency Modulation of Gunn Oscillators," H. Statz et al., vol. 11, No. 3, August 1968.

JOHN W. HUCKERT, Primary Examiner

E. WOJCIECHOWICZ, Assistant Examiner

U.S. Cl. X.R.

317—234 V, 235 UA, 234 S, 235 AE; 331—107 G